(12) United States Patent
Zhang et al.

(10) Patent No.: US 10,168,148 B2
(45) Date of Patent: Jan. 1, 2019

(54) DISPLAY SUBSTRATE, DISPLAY DEVICE AND METHOD FOR RECOGNIZING POSITION MARK

(71) Applicants: BOE Technology Group Co., Ltd., Beijing (CN); Beijing BOE Display Technology Co., Ltd., Beijing (CN)

(72) Inventors: Haibo Zhang, Beijing (CN); Zhangwei Dang, Beijing (CN); Qingliang Zhang, Beijing (CN); Heng Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/515,300

(22) PCT Filed: Aug. 10, 2016

(86) PCT No.: PCT/CN2016/094402
§ 371 (c)(1),
(2) Date: Mar. 29, 2017

(87) PCT Pub. No.: WO2017/128693
PCT Pub. Date: Aug. 3, 2017

(65) Prior Publication Data
US 2018/0087899 A1 Mar. 29, 2018

(30) Foreign Application Priority Data
Jan. 29, 2016 (CN) .......................... 2016 1 0065507

(51) Int. Cl.
*G01B 11/14* (2006.01)
*G01B 11/27* (2006.01)
(Continued)

(52) U.S. Cl.
CPC ............ *G01B 11/272* (2013.01); *G02B 5/003* (2013.01); *G02F 1/1333* (2013.01);
(Continued)

(58) Field of Classification Search
CPC ......... G03F 9/7088; G03F 1/42; G01B 11/14; G01B 11/272; G01B 11/27; H01L 2223/54426; H01L 23/544; G02B 5/003
(Continued)

(56) References Cited

U.S. PATENT DOCUMENTS 5,500,736 A * 3/1996 Koitabashi ................ G03F 9/70
250/548
6,765,673 B1 * 7/2004 Higashikawa ............ G03F 1/78
250/559.45
(Continued)

FOREIGN PATENT DOCUMENTS

CN 1315011 A 9/2001
CN 103572246 A 2/2014
(Continued)

OTHER PUBLICATIONS

First Office Action for Chinese Patent Application No. 201610065507.4 dated Jun. 7, 2017.
(Continued)

*Primary Examiner* — Hoa Pham
(74) *Attorney, Agent, or Firm* — Calfee, Halter & Griswold LLP

(57) ABSTRACT

The present disclosure provides a display substrate, a display device and a method for recognizing a positioning mark. The display substrate includes a substrate, and a first pattern and a second pattern formed on a first side of the substrate; the second pattern is disposed between the first pattern and the substrate, and the first pattern has a first through hole directly facing the second pattern; the first
(Continued)

pattern and the second pattern are formed of materials having different reflectances, and the first through hole serves as a positioning mark on a first side of the substrate for positioning the first side of the substrate.

14 Claims, 3 Drawing Sheets

(51) Int. Cl.
  *G02F 1/1333* (2006.01)
  *H01L 23/544* (2006.01)
  *G02B 5/00* (2006.01)
(52) U.S. Cl.
  CPC .... *H01L 23/544* (2013.01); *H01L 2223/5442* (2013.01); *H01L 2223/54426* (2013.01)
(58) Field of Classification Search
  USPC .... 356/399–401, 614–623; 250/559.45, 548; 430/30
  See application file for complete search history.

(56) References Cited

U.S. PATENT DOCUMENTS

| | | | |
|---|---|---|---|
| 6,787,930 B1* | 9/2004 | Nakata | H01L 23/544 257/797 |
| 9,245,851 B2 | 1/2016 | Nishikawa et al. | |
| 2004/0029028 A1* | 2/2004 | Shimizu | G01B 11/0608 430/30 |
| 2006/0001879 A1* | 1/2006 | Presura | G03F 9/7076 356/401 |
| 2014/0033974 A1 | 2/2014 | Hong et al. | |
| 2015/0021781 A1 | 1/2015 | Nishikawa et al. | |

FOREIGN PATENT DOCUMENTS

| | | |
|---|---|---|
| CN | 104299960 A | 1/2015 |
| CN | 105572938 A | 5/2016 |
| EP | 2692896 A1 | 2/2014 |
| JP | 08146371 A | 6/1996 |
| JP | 2000182914 A | 6/2000 |
| JP | 2001075108 A | 3/2001 |

OTHER PUBLICATIONS

Second Office Action for Chinese Patent Application No. 201610065507.4 dated Jan. 29, 2018.

International Search Report for International Application No. PCT/CN2016/094402 dated Nov. 10, 2016.

\* cited by examiner

DISPLAY SUBSTRATE, DISPLAY DEVICE AND METHOD FOR RECOGNIZING POSITION MARK

CROSS-REFERENCE TO RELATED APPLICATIONS

The present application is based on International Application No. PCT/CN2016/094402, filed on Aug. 10, 2016, which is based upon and claims priority to Chinese Patent Application No. 201610065507.4, filed on Jan. 29, 2016, and the entire contents thereof are incorporated herein by reference.

TECHNICAL FIELD

The present disclosure relates to the technical field of display, and more particularly to a display substrate, a display device and a method for recognizing a positioning mark.

BACKGROUND

Currently, in the production process of the display device, positioning marks are need to be set respectively on the upper side and lower side of the display substrate to carry out grinding, inspection, pasting Pol and other processes. Since a mark Mark in the related art needs to be designed to locate in a blank region, the blank region where the Mark is located will have a light leakage after a backlight is installed in the panel. In order to prevent the light leakage, the region has to be processed at later steps. Therefore, the production process of the display device becomes complicated, the cost increases, and the product quality is not high.

In addition, reserving a blank region for the mark on the substrate does not conform to the development trend that the display device has a narrow frame or even the display device has no frame.

It should be noted that, information disclosed in the above background portion is provided only for better understanding of the background of the present disclosure, and thus it may contain information that does not form the prior art known by those ordinary skilled in the art.

SUMMARY

The object of the present disclosure is to provide a setting scheme for a positioning mark which does not require a treatment of preventing light-leaking performed on the region where the positioning mark is located, and improves the fabricating efficiency of the display device, thereby reducing the production cost.

In order to achieve the above described object, according to a first aspect, an embodiment of the present disclosure provides a display substrate, comprising: a first pattern and a second pattern formed on a first side of a substrate. The second pattern is disposed between the first pattern and the substrate. The first pattern has a first through hole directly facing the second pattern. The first pattern and the second pattern are formed of materials having different reflectances. The first through hole serves as a positioning mark on a first side of the substrate for positioning the first side of the substrate.

According to a second aspect, the present disclosure further provides a display device, comprising the above described display substrate.

In addition, the present disclosure further provides a method for recognizing a positioning mark, which is applicable to the above described display substrate, comprising: irradiating the first side of a substrate; and determining the first through hole as a positioning mark on the first side of the substrate according to the reflected light of the first side of the substrate, and the positioning mark is used to position the first side of the substrate.

DETAILED DESCRIPTION

Figure 1:
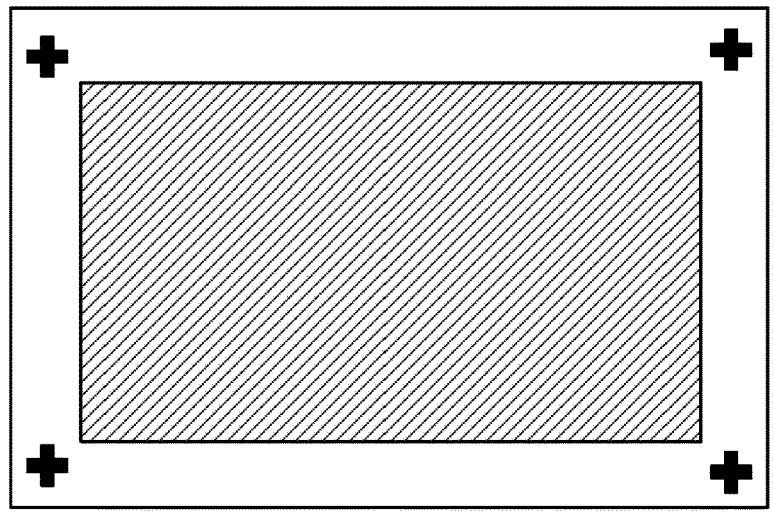
FIG. 1 shows a display substrate provided with a positioning mark.

In order to make technical problems to be solved, technical solutions and advantages of the present disclosure clearer, hereinafter, the present disclosure will be further described in detail in conjunction with the accompanying drawings and the embodiments. It is apparent that the described embodiments are part of embodiments of the present disclosure, not all embodiments. All other embodiments obtained by those of ordinary skill in the art are within the scope of the present disclosure, based on the described embodiments of the present disclosure Unless defined otherwise, technical terms or scientific terms used herein are to be interpreted as the ordinary meaning understood by those skilled in the art. The "first", "second" and similar words used in the present specification and the claims are not meant to be in any order, quantity or importance, but merely to distinguish between different constituent parts. Similarly, similar words such as "a" or "an" do not represent a quantity limit, but rather that there is at least one. The words "connected" or "connecting" and the like are not limited to physical or mechanical connections, but may include electrical connections, whether direct or indirect. "Upper", "lower", "left", "right" and the like are used only to represent the relative positional relationship, and when the absolute position of the object to be described changes, the relative position relation is changed accordingly FIG. 1 shows a substrate of a display device, where it is necessary to design a positioning mark Mark (i.e., the black cross pattern in FIG. 1) in the blank region of the edge of the substrate. Light can pass through the blank region of the substrate from up to down. Thus the positioning mark Mark can serve as an alignment mark of the upper side or the lower side of the substrate. As the Mark needs to be designed to locate in the blank region, the blank region where the Mark is located in will have a light leakage after the backlight is installed in the panel. In order to prevent the light leakage, the region has to be processed at later steps. Therefore, the production process of the display device becomes complicated, the cost increases, and the product quality is not high. In addition, reserving a blank region for the Mark on the substrate does not conform to the development trend that the display device has a narrow frame or even the display device has no frame.

In view of the problems in the related art, the present disclosure provides a new design of a positioning mark which does not need to be provided on a blank region of the substrate, so that no additional process is required to perform a treatment of preventing light-leaking on the blank region.

Figure 2:
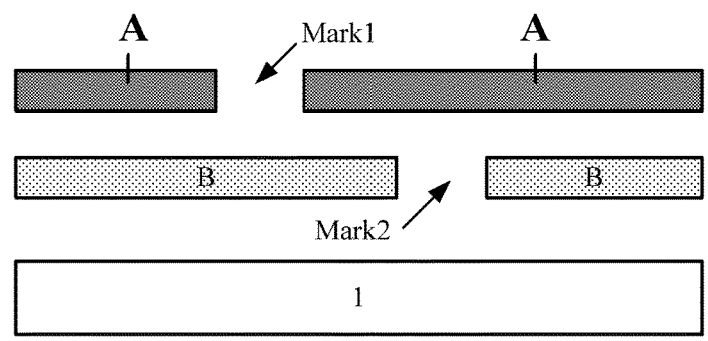
FIG. 2 is a structure diagram of a first side of a touch substrate according to the present disclosure.

According to a first aspect, an embodiment of the present disclosure provides a display substrate, as shown in FIG. 2, comprising a first pattern A and a second pattern B formed on the first side (i.e., the upper side of the substrate 1 in FIG. 2) of the substrate 1. The second pattern is provided between the first pattern A and the substrate 1. The first pattern A has a first through hole Mark 1 which is directly facing the second pattern B. In the present embodiment, the first pattern A and the second pattern B are formed of materials having different reflectances. The position of the first through hole Mark 1 can be accurately recognized by a reflected-light detection method. Therefore, the first through hole Mark 1 is used as a positioning mark in the processes of cutting, masking, inspecting, pasting and the like performed on the first side of the substrate 1.

Figure 3:
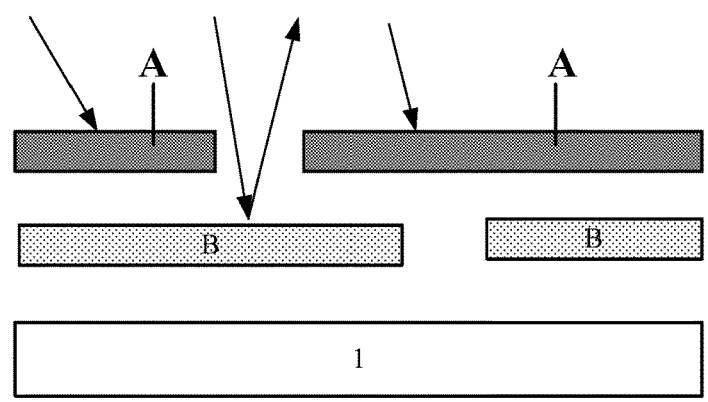
FIG. 3 is a view showing recognizing a positioning mark on the first side of the display substrate according to the present disclosure.

As an example, it is assumed that the first pattern A is formed of a light absorbing material and the second pattern B is formed of a light-reflective material. It is understood that the reflectance of the light-reflective material is generally greater than the reflectance of the light absorbing material. When the first side of the substrate 1 is positioned, the first side of the substrate 1 only needs to be irradiated. Referring to FIG. 3, it is apparent that the intensity of the reflected light generated by the light striking on the first through hole is larger than the intensity of the reflected light generated by the light striking on the first pattern A. Taking the first through hole being a cross shape as an example (the first through-hole can also be circular or other polygons), referring to FIG. 4, by means of the reflected light recognition method, a cross mark with higher brightness than surroundings will be determined finally on the substrate, thus the cross mark is the first through hole serving as the positioning mark.

Similarly, if the first pattern A is formed of a light-reflective material and the second pattern B is formed of a light-absorbing material, a cross mark with lower brightness than the surroundings will be finally recognized, and this will not be elaborated herein.

It can be seen that in the substrate of the present embodiment, the positioning mark does not need to be provided on the region where the substrate is completely light-transmissive, so that it is not necessary to use an additional fabricating process to perform the treatment of preventing light-leaking on the light-transmissive region, thereby simplifying the fabrication process of an array substrate, thus reducing production costs.

Of course, the positioning mark on the second side (i.e., the lower side of the substrate 1 in FIG. 2, which is the opposite side of the first side on the substrate) of the substrate 1 may be provided by using the method of the present disclosure. That is, on the basis of the above described embodiment shown in FIG. 2, the second pattern B of the present embodiment has a second through hole Mark 2 directly facing the first pattern A. The forward projection of the second through-hole Mark 2 on the first side of the substrate 1 is shifted from the forward projection of the first through-hole Mark 1 on the first side of the substrate 1, and the second through-hole Mark 2 serves as the positioning mark of the second side of the substrate 1.

Figure 5:
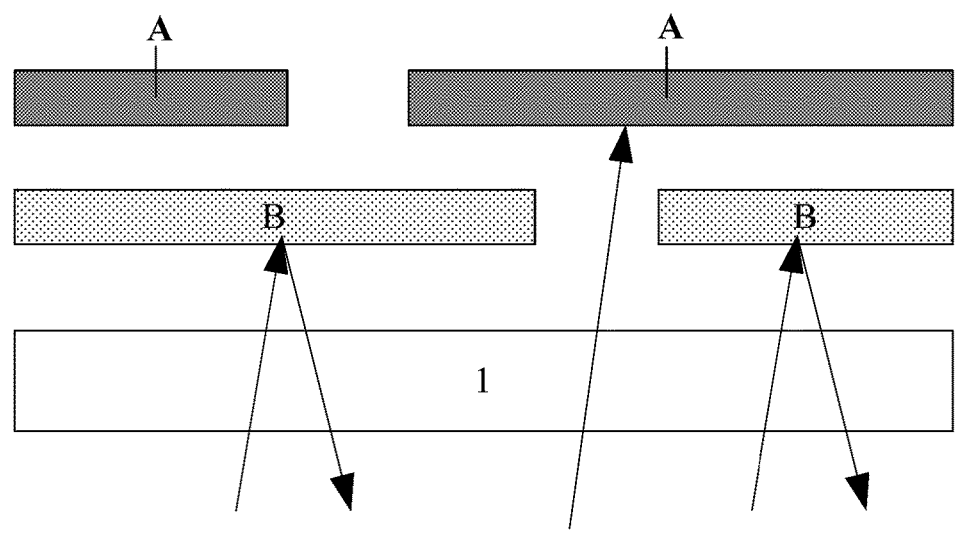
FIG. 5 is a view showing recognizing a positioning mark on a second side of the display substrate according to the present disclosure.
Figure 6:
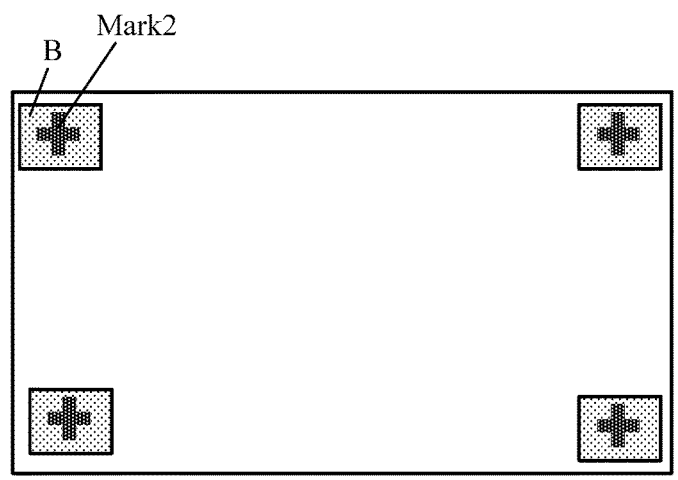
FIG. 6 is a top view of a second side of the display substrate according to the present disclosure.

As an example, the first pattern A is formed of a light-absorbing material and the second pattern B is formed of a light-reflective material. When the positioning mark of the second side of the substrate 1 is recognized, the second side of the substrate 1 only needs to be irradiated. Referring to FIG. 5, it is apparent that the intensity of the reflected light generated by the light striking on the second through-hole is smaller than the intensity of the reflected light generated by the light striking on the first pattern A. Taking the second through-hole being a cross shape as an example (the second through-hole can also be circular or other polygons), referring to FIG. 6, through the reflected light recognition method, a cross mark with lower brightness than the surroundings will be determined finally on the second side of the substrate, thus the cross mark is the second through hole serving as the positioning mark used when positioning the second side of the substrate 1.

By way of comparison, it is known that the positioning marks in the related art are formed of one material layer and need to be provided on a separate transparent region of the display substrate. However, the positioning marks of the present disclosure are formed by two layers of material having different reflectances, which are not necessary to be provided on a transparent region.

In addition, in order not to provide an additional manufacturing process, the existing fabricating process of patterns on the display substrate can be used to produce the first pattern and the second pattern according to the present disclosure.

According to the display device in the related art, the black matrix on the substrate and the metal pattern (the metal pattern generally refers to a data line, a scanning line, etc.) have a significant difference in the reflectances or the absorption rates of the light. Thus, one of the first pattern and the second pattern of the present embodiment may be formed in the same layer and with the same material as the black matrix of the display device in one patterning process. The other of the first pattern and the second pattern may be formed in the same layer and with the same material as the metal pattern of the display device (the metal pattern generally refers to the signal line on the substrate) in one patterning process.

As can be understood from the above technical solution, the first pattern and the second pattern of the display substrate of the present embodiment can be formed by using the one patterning process as other existing functional patterns, so that an additional layer structure of the display substrate is not necessary, nor an additional fabricating process of the display substrate.

Further, in a specific display substrate, the first pattern and the second pattern in the present embodiment may refer to the black matrix and the metal pattern on the display substrate, thus the existing patterns may be reused as the positioning marks, and an extra space of the display substrate can be avoided from being occupied, thus it conforms to the development trend that the display device has a narrow frame or even the display device has no frame.

Figure 4:
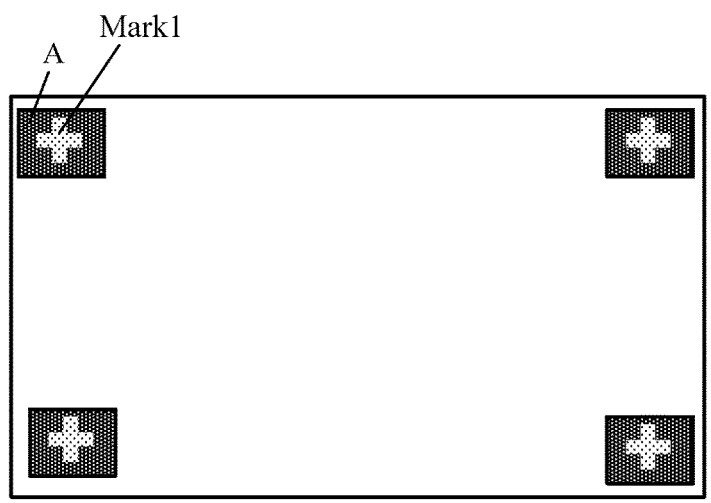
FIG. 4 is a top view of a first side of a touch substrate according to the present disclosure.

In addition, according to the present embodiment, there may be a plurality of the first through holes and the second through holes serving as positioning marks. Alternatively, as shown in FIGS. 4 and 5, the number of first through-holes Mark 1 and/or the number of the second through-holes Mark 2 are four. As an example, the four first through holes are distributed as four vertices of a rectangle. The four second through holes are distributed as four vertices of another rectangle. By using the four positioning marks on each side of the display substrate, the positioning in the vertical direction and the horizontal direction can be accurately performed.

The above-mentioned display substrate provided in the present embodiment has the following advantageous effects as compared with the related art:

1) a transparent region does not need to be provided in the substrate, thus it is not required to perform the treatment of preventing light-leaking;

2) the positioning mark and the existing patterns on the substrate can be formed by one patterning process, thus no extra fabricating cost is needed;

3) the first pattern and the second pattern forming the positioning marks is also the existing black matrix and metal pattern on the display substrate, an extra space in the horizontal direction of the display substrate can be avoided from being occupied, thus it conforms to the development towards that the display device has a narrow frame or even the display device has no frame.

According to a second aspect, the embodiment of the present disclosure also provides a method for recognizing a positioning mark, which is applicable to the above-described display substrate.

Based on the display substrate, the method for recognizing the positioning mark on the first side of the substrate in the present embodiment comprises the following steps.

Step 1, a first side of the substrate is irradiated;

Step 2, the first through hole is determined as the positioning mark on the first side of the substrate based on the reflected light from the first side of the substrate, and the positioning mark is used to position the first side of the substrate.

Similarly, the method for identifying the positioning mark on the second side of the substrate in the present embodiment comprises the following steps.

Step 3, a second side of the substrate is irradiated;

Step 4, the second through hole is determined as the positioning mark on the second side of the substrate based on the reflected light from the second side of the substrate, and the positioning mark is used to position the second side of the substrate.

As can be understood from the above description, the technical solution according to the present embodiment can recognize the positioning mark provided on the display substrate by the reflected light detection method, and has a high practical value because it is simple and easy to implement.

Figure 7:
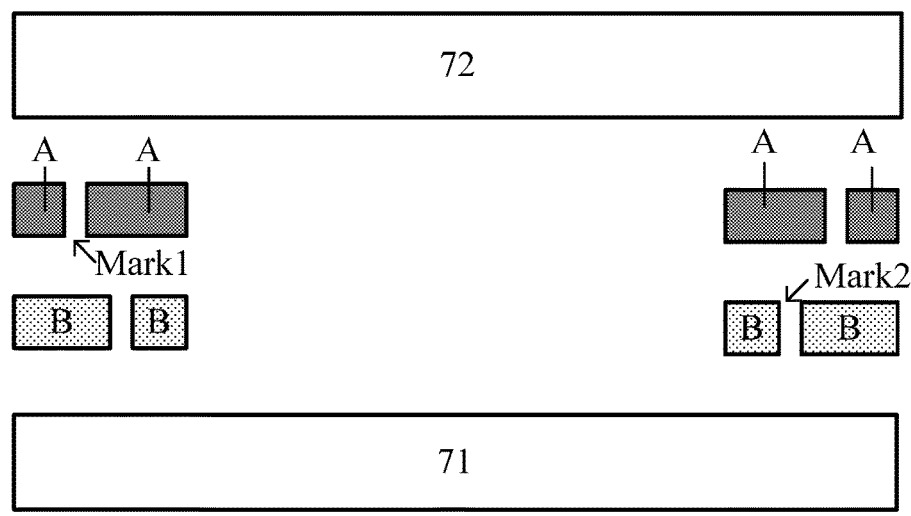
FIG. 7 is a structure diagram of a display device according to the present disclosure.

In addition, the present embodiment further provides a display device comprising the above-described display substrate. As shown in FIG. 7, the display device according to the present embodiment is composed of a color film substrate 72 and an array substrate 71 which are formed in cell assembly. Herein, the array substrate 71 is a display substrate as described above. A black matrix A and a metal pattern B are formed on the array substrate 71. The black matrix A has a first through hole Mark 1 directly facing the metal pattern B. The first through hole Mark 1 serves as a positioning mark above the color film substrate. When the processes of cutting, masking, providing a polarizer are performed on the upper side of the color film substrate, the positioning can be performed according to the first through hole Mark 1. The metal pattern B has a second through-hole Mark 2 corresponding to the black matrix A. The second through-hole Mark 2 serves as a positioning mark under the array substrate 71. Similarly, when the processes of cutting, masking, providing a polarizer are performed under the array substrate, the positioning can be performed according to the second through hole Mark 2.

According to the present embodiment, the positioning mark which can be recognized by the reflected light is produced by using the reflectances of the metal pattern and the black matrix. Since it is not necessary to be provided on the transparent area of the display substrate, it is not necessary to use an additional fabricating process to perform the anti-leak light treatment on the region where the positioning mark is provided, the production efficiency of the display device can be improved, thus reducing production costs.

It is to be noted that the structure shown in FIG. 7 is for illustrative purpose only and that the black matrix of the present disclosure may be provided under the metal pattern. In addition, in the present embodiment, the metal pattern and the black matrix are not necessarily formed on one display substrate. For example, a black matrix may be formed on the color film substrate of the display device, and the metal pattern may be formed on the array substrate of the display device.

The above described contents are merely optional embodiments of the present disclosure and it should be noted that it will be apparent to those skilled in the art that certain alterations and modifications may be made without departing from the principles of the present disclosure, and such alterations and modifications should also be regarded as the scope of protection of the present disclosure.

What is claimed is:

1. A display substrate, comprising:
a substrate, and a first pattern and a second pattern formed on a first side of the substrate;
wherein the second pattern is disposed between the first pattern and the substrate, and the first pattern comprises at least one first through hole directly facing the second pattern; and
wherein the first pattern and the second pattern are formed of materials having different reflectances, and the first through hole serves as a positioning mark on a first side of the substrate for positioning the first side of the substrate;
the second pattern comprises a second through hole directly facing the first pattern;
a forward projection of the second through-hole on the first side of the substrate is shifted from a forward projection of the first through-hole on the first side of the substrate;
the second through hole serves as a positioning mark on a second side of the substrate for positioning the second side of the substrate; and
the second side is a side opposite to the first side on the substrate.

2. The display substrate of claim 1 further comprising:
a metal pattern and a black matrix pattern;
wherein the first pattern is formed in the same layer and with the same material as the metal pattern, and the second pattern is formed in the same layer and with the same material as the black matrix pattern.

3. The display substrate of claim 1 further comprising:
a metal pattern and a black matrix pattern;
wherein the first pattern is formed in the same layer and with the same material as the black matrix, and the second pattern is formed in the same layer and with the same material as the metal pattern.

4. The display substrate of claim 1, wherein
the first pattern is a metal pattern of the display substrate, the second pattern is a black matrix of the display substrate; or
the first pattern is a black matrix of the display substrate, and the second pattern is a metal pattern of the display substrate.

5. The display substrate of claim 1, wherein
there are four first through holes distributed as four vertices of a rectangle.

6. The display substrate of claim 1, wherein
there are four second through holes distributed as four vertices of another rectangle.

7. The display substrate of claim 1, wherein
the patterns of the first through hole and the second through hole are circular or polygonal.

8. The display substrate of claim 1, wherein the first through hole and the second through hole are provided in a no-display region.

9. The display substrate of claim 1, wherein the first pattern is formed of a light-absorbing material, and the second pattern is formed of a light-reflective material.

10. The display substrate of claim 1, wherein the first pattern is formed of a light-reflective material, and the second pattern is formed of a light-absorbing material.

11. A display device, comprising a display substrate which comprises:
a substrate, and a first pattern and a second pattern formed on a first side of the substrate;
wherein the second pattern is disposed between the first pattern and the substrate, and the first pattern comprises at least one first through hole directly facing the second pattern; and
wherein the first pattern and the second pattern are formed of materials having different reflectances, and the first through hole serves as a positioning mark on a first side of the substrate for positioning the first side of the substrate;
the second pattern comprises a second through hole directly facing the first pattern;
a forward projection of the second through-hole on the first side of the substrate is shifted from a forward projection of the first through-hole on the first side of the substrate;
the second through hole serves as a positioning mark on a second side of the substrate for positioning the second side of the substrate; and
the second side is a side opposite to the first side on the substrate.

12. The display device of claim 11 further comprising:
a metal pattern and a black matrix pattern;
wherein the first pattern is formed in the same layer and with the same material as the metal pattern, and the second pattern is formed in the same layer and with the same material as the black matrix pattern.

13. A method for recognizing a positioning mark, which is applicable to the display substrate, which comprises: a substrate, and a first pattern and a second pattern formed on a first side of the substrate; wherein the second pattern is disposed between the first pattern and the substrate, and the first pattern comprises at least one first through hole directly facing the second pattern; and wherein the first pattern and the second pattern are formed of materials having different reflectances, and the first through hole serves as a positioning mark on a first side of the substrate for positioning the first side of the substrate, the method comprises:
irradiating the first side of the substrate; and
determining the first through hole as a positioning mark on the first side of the substrate according to the reflected light of the first side of the substrate, and the positioning mark is used to position the first side of the substrate;
the second pattern comprises a second through hole directly facing the first pattern;
a forward projection of the second through-hole on the first side of the substrate is shifted from a forward projection of the first through-hole on the first side of the substrate;
the second through hole serves as a positioning mark on a second side of the substrate for positioning the second side of the substrate; and
the second side is a side opposite to the first side on the substrate.

14. The method of claim 13, wherein
the second pattern comprises a second through hole directly facing the first pattern; the forward projection of the second through-hole on the first side of the substrate is shifted from the forward projection of the first through-hole on the first side of the substrate;
the method further comprises:
irradiating the second side of the substrate, the second side is a side opposite to the first side on the substrate;
determining the second through hole as a positioning mark on the second side of the substrate according to the reflected light of the second side of the substrate, and the positioning mark is used to position the second side of the substrate.

* * * * *